United States Patent
Ke et al.

(10) Patent No.: US 12,334,456 B2
(45) Date of Patent: Jun. 17, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chung-Yu Ke, Taichung (TW); Liang-Pin Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 589 days.

(21) Appl. No.: 17/858,905

(22) Filed: Jul. 6, 2022

(65) Prior Publication Data
US 2023/0402409 A1  Dec. 14, 2023

(30) Foreign Application Priority Data
May 26, 2022 (TW) .................................. 111119694

(51) Int. Cl.
| | |
|---|---|
| H01L 23/66 | (2006.01) |
| H01L 21/48 | (2006.01) |
| H01L 23/367 | (2006.01) |
| H01L 23/373 | (2006.01) |
| H01Q 1/22 | (2006.01) |
| H01L 23/00 | (2006.01) |
| H01L 25/065 | (2023.01) |

(52) U.S. Cl.
CPC .......... *H01L 23/66* (2013.01); *H01L 21/4882* (2013.01); *H01L 23/367* (2013.01); *H01L 23/3736* (2013.01); *H01Q 1/2283* (2013.01); *H01L 24/16* (2013.01); *H01L 24/32* (2013.01); *H01L 24/73* (2013.01); *H01L 25/0655* (2013.01); *H01L 2223/6616* (2013.01); *H01L 2223/6688* (2013.01); *H01L 2224/16237* (2013.01); *H01L 2224/32225* (2013.01); *H01L 2224/73204* (2013.01); *H01L 2924/2027* (2013.01)

(58) Field of Classification Search
CPC ................ H01Q 1/2283; H01Q 21/065; H01L 2223/6677; H01L 2223/6616; H01L 21/4882; H01L 23/367; H01L 23/3736
See application file for complete search history.

(56) References Cited

U.S. PATENT DOCUMENTS

2019/0319338 A1* 10/2019 Gu .......................... H01L 22/32

FOREIGN PATENT DOCUMENTS

| EP | 3346548 B1 * | 4/2020 | ............... H01Q 1/02 |
| TW | I745238 B * | 11/2021 | ............... H01Q 1/38 |

* cited by examiner

*Primary Examiner* — Lawrence C Tynes, Jr.
(74) *Attorney, Agent, or Firm* — Studebaker Brackett PLLC

(57) ABSTRACT

An electronic package is provided, in which a plurality of antenna structures and a heat sink are integrated on a package module including an electronic element, so as to guide the heat energy generated by the electronic element out of the package module via the heat sink. Therefore, when the electronic package is configured with the plurality of antenna structures, the heat dissipation of the electronic element can be improved.

21 Claims, 6 Drawing Sheets

ELECTRONIC PACKAGE AND MANUFACTURING METHOD THEREOF

BACKGROUND

1. Technical Field

The present disclosure relates to an electronic package, and more particularly, to an electronic package having an antenna structure and a manufacturing method thereof.

2. Description of Related Art

At present, wireless communication technology has been widely used in various consumer electronic products (such as mobile phones, tablet computers, etc.) to facilitate receiving or sending various wireless signals. In addition, in order to meet the portability of consumer electronic products and the convenience of surfing the Internet, the manufacture and design of wireless communication modules are developed towards the needs of light, thin, short and small, wherein patch antennas are widely used in wireless communication modules of electronic products due to their characteristics of small size, light weight and easy manufacture.

At present, the related application technology of 5G will be fully commercialized in the future, and its application frequency range is about 1 GHz to 1000 GHz high-frequency frequency band, and its commercial application mode is 5G with 4G LTE, and a cellular base station is set up outdoors so as to cooperate with the small base station located indoors. Therefore, 5G mobile communication will use a large number of antennas in the base station to meet the requirements of the 5G system for large-capacity, fast transmission and low latency.

FIG. 1A is a schematic perspective view of a conventional semiconductor package 1 having an antenna structure. As shown in FIG. 1, the semiconductor package 1 comprises: a semiconductor chip 11 having a plurality of electrode pads 110, a plurality of conductive pillars 13, a cladding layer 15 covering the semiconductor chip 11 and the plurality of conductive pillars 13, a carrier structure 10 and a circuit structure 16 arranged on opposite sides of the cladding layer 15 to be electrically connected to each other via the plurality of conductive pillars 13, a plurality of conductive elements 17 disposed on the carrier structure 10 to connect to a circuit board 8, an insulating spacer 14 disposed on the circuit structure 16 by a bonding layer 12, a plurality of first antenna bodies 18b disposed on the circuit structure 16 by the bonding layer 12, and a plurality of second antenna bodies 19b disposed on the insulating spacer 14.

The electrode pads 110 of the semiconductor chip 11 are provided with conductive bumps 112 to electrically connect the circuits of the carrier structure 10, and during the manufacturing process, the conductive bumps 112 can be covered with a protective film 114 according to requirements.

The carrier structure 10 is provided with a first antenna layer 18a, and the circuit structure 16 is provided with a second antenna layer 19a, so that the first antenna bodies 18b correspond to the position of the first antenna layer 18a to form a low-frequency antenna structure 18, and the second antenna bodies 19b correspond to the position of the second antenna layer 19a to form a high-frequency antenna structure 19 surrounded by the low-frequency antenna structure 18, as shown in FIG. 1B, and the semiconductor chip 11 controls the operations of the low-frequency antenna structure 18 and the high-frequency antenna structure 19.

However, in the conventional semiconductor package 1, the semiconductor chip 11 is embedded in the cladding layer 15, resulting in poor heat dissipation, which affects the semiconductor chip 11 to provide electrical functions required for operating a 5G system. It cannot even meet the requirements of the antenna operation of the 5G system.

Furthermore, in the conventional semiconductor package 1, the conductive pillars 13 are disposed at the periphery of the semiconductor chip 11, so that the high-frequency antenna structure 19 cannot be superimposed above the conductive pillars 13. Therefore, when the signal of the high-frequency antenna structure 19 needs to be transmitted to the circuit board 8 via the conductive pillars 13, the signal needs to be fanned out to the periphery of a vertical projection area Z of the high-frequency antenna structure 19 via the circuit structure 16. At this point, the path (the signal path L1 shown in FIG. 1A) of the high-frequency antenna structure 19 for transmitting the antenna signal is too long, resulting in the transmission speed of the antenna signal being too slow.

Therefore, how to overcome the above-mentioned drawbacks of the prior art has become an urgent issue to be solved at present.

SUMMARY

In view of the various deficiencies of the prior art, the present disclosure provides an electronic package, which comprises: a package module internally configured with at least one electronic element and a plurality of feeding lines electrically connected to the at least one electronic element, wherein the plurality of feeding lines are defined with a first antenna layer and a second antenna layer; a heat sink disposed on a portion of a surface of the package module and extending into the package module to thermally connect the at least one electronic element; first antenna bodies disposed on portions of the surface of the package module corresponding to a position of the first antenna layer, wherein the first antenna bodies and the first antenna layer are kept at a distance, such that the first antenna bodies and the first antenna layer form a first antenna structure; an insulating spacer disposed on a portion of the surface of the package module; and second antenna bodies disposed on the insulating spacer corresponding to a position of the second antenna layer, wherein the second antenna bodies and the second antenna layer are located on opposite sides of the insulating spacer, such that the second antenna bodies and the second antenna layer form a second antenna structure.

The present disclosure provides a method of manufacturing an electronic package, the method comprises: providing a package module internally configured with at least one electronic element and a plurality of feeding lines electrically connected to the at least one electronic element, wherein the plurality of feeding lines are defined with a first antenna layer and a second antenna layer; disposing an insulating spacer on a portion of a surface of the package module; forming a heat sink on a portion of the surface of the package module, wherein the heat sink extends into the package module to thermally connect the at least one electronic element; and forming first antenna bodies on portions of the surface of the package module corresponding to a position of the first antenna layer and forming second antenna bodies on the insulating spacer corresponding to a position of the second antenna layer, wherein the first antenna bodies and the first antenna layer are kept at a distance, such that the first antenna bodies and the first antenna layer form a first antenna structure, and wherein the second antenna bodies and the second antenna layer are located on opposite sides of the insulating spacer, such that the second antenna bodies and the second antenna layer form a second antenna structure.

In the aforementioned manufacturing method, the manufacturing process of the heat sink comprises: forming a recess portion in the package module to expose the at least one electronic element; and forming a metal material in the recess portion and protruding from the surface of the package module, so that the metal material becomes the heat sink.

In the aforementioned electronic package and the manufacturing method thereof, the heat sink is annular.

In the aforementioned electronic package and the manufacturing method thereof, the heat sink surrounds the insulating spacer.

In the aforementioned electronic package and the manufacturing method thereof, the insulating spacer is a dielectric layer.

In the aforementioned electronic package and the manufacturing method thereof, the first antenna bodies and the first antenna layer transmit signals in a coupled manner.

In the aforementioned electronic package and the manufacturing method thereof, the second antenna bodies and the second antenna layer transmit signals in a coupled manner.

In the aforementioned electronic package and the manufacturing method thereof, the package module includes a cladding layer covering the at least one electronic element, wherein the first antenna bodies and the first antenna layer are located on opposite sides of the cladding layer. Further, the package module further includes a plurality of conductive pillars embedded in the cladding layer and a first circuit structure and a second circuit structure disposed on the opposite sides of the cladding layer to be electrically connected to each other via the plurality of conductive pillars, wherein the first circuit structure is provided with the first antenna layer, and the second circuit structure is provided with the second antenna layer, such that the insulating spacer and the first antenna bodies are disposed on one surface of the second circuit structure. For example, a plurality of the electronic elements are embedded in the cladding layer, such that the plurality of conductive pillars are located between at least two of the electronic elements; or, the second antenna structure is superimposed on the plurality of conductive pillars.

In the aforementioned electronic package and the manufacturing method thereof, the heat sink is in contact with the at least one electronic element.

As can be seen from the above, in the electronic package and the manufacturing method thereof of the present disclosure, the thermal energy generated by the electronic element is guided out of the package module via the heat sink, so that the electronic element can dissipate heat according to requirements. Therefore, compared with the prior art, when the electronic package is configured with a plurality of antenna structures, the heat dissipation of the electronic element can be improved, so that the electronic package can provide electrical functions required to operate the 5G system, so as to meet the requirements of the antenna operation of the 5G system.

Furthermore, by superimposing the second antenna structure on the plurality of conductive pillars, it is beneficial to reduce the path for the second antenna structure to transmit the antenna signal to the external circuit board, so that the transmission speed of the antenna signal can be increased.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2H are schematic cross-sectional views illustrating a method of manufacturing an electronic package 2 according to the present disclosure.

Figure 1A:
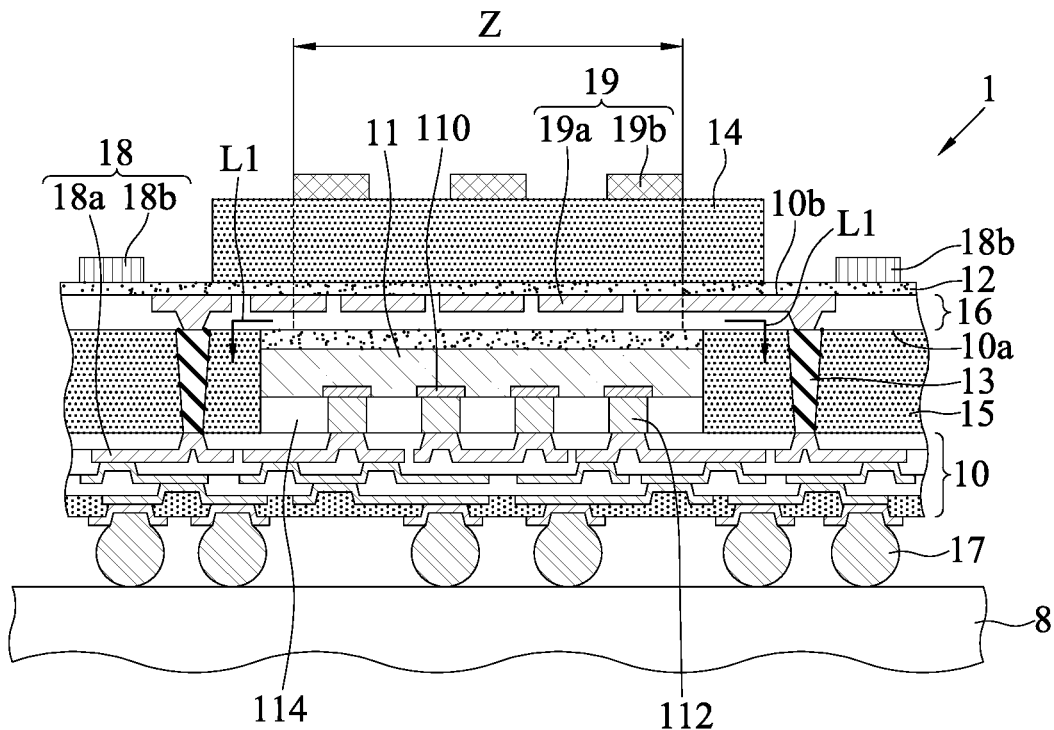
FIG. 1A is a schematic cross-sectional view of a conventional semiconductor package.
Figure 1B:
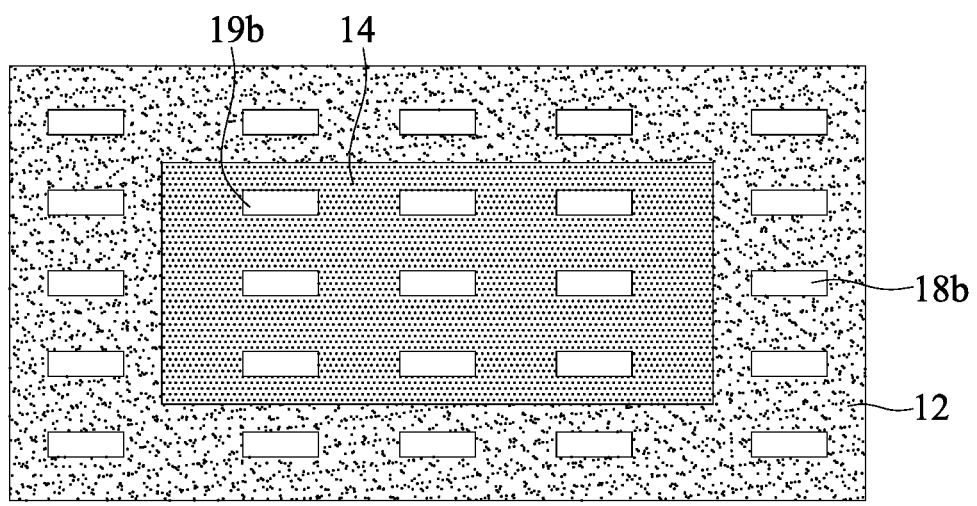
FIG. 1B is a schematic top plan view of FIG. 1A.
Figure 2A:
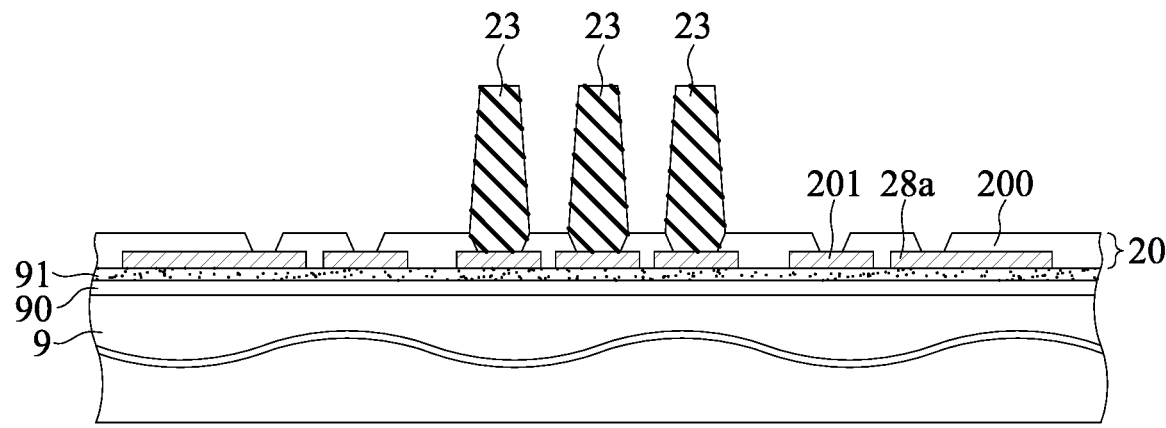
FIG. 2A to FIG. 2H are schematic cross-sectional views illustrating a method of manufacturing an electronic package according to the present disclosure.

As shown in FIG. 2A, a first circuit structure 20 disposed on a carrier board 9 is provided, and a plurality of conductive pillars 23 are formed on the first circuit structure 20.

In an embodiment, the first circuit structure 20 is, for example, a substrate structure, and the substrate structure is with a core layer or without a core layer (coreless), wherein the first circuit structure 20 may include at least one first insulating layer 200 and at least one first circuit layer 201 disposed on the first insulating layer 200. For example, the specification of the first circuit layer 201 is a redistribution layer (RDL), the material for forming the first circuit layer 201 is copper, and the material for forming the first insulating layer 200 is a dielectric material such as polybenzoxazole (PBO), polyimide (PI), prepreg (PP) and the like.

Furthermore, the first circuit structure 20 is further configured with a first antenna layer 28a electrically connected to the first circuit layer 201. For example, the first antenna layer 28a is fabricated together with the first circuit layer 201 by an RDL process.

In addition, the carrier board 9 is, for example, a board body made of semiconductor material (such as silicon or glass), on which a release layer 90 and an adhesive layer 91 are sequentially formed by coating for the first circuit structure 20 to be disposed on the adhesive layer 91.

In addition, the conductive pillars 23 are, for example, pillar bodies, linear bodies or spherical bodies, which are erected on the first circuit layer 201 and electrically connected to the first circuit layer 201, wherein the material for forming the conductive pillars 23 is a metal material such as copper or gold or a solder material, but is not limited to the above.

Figure 2B:
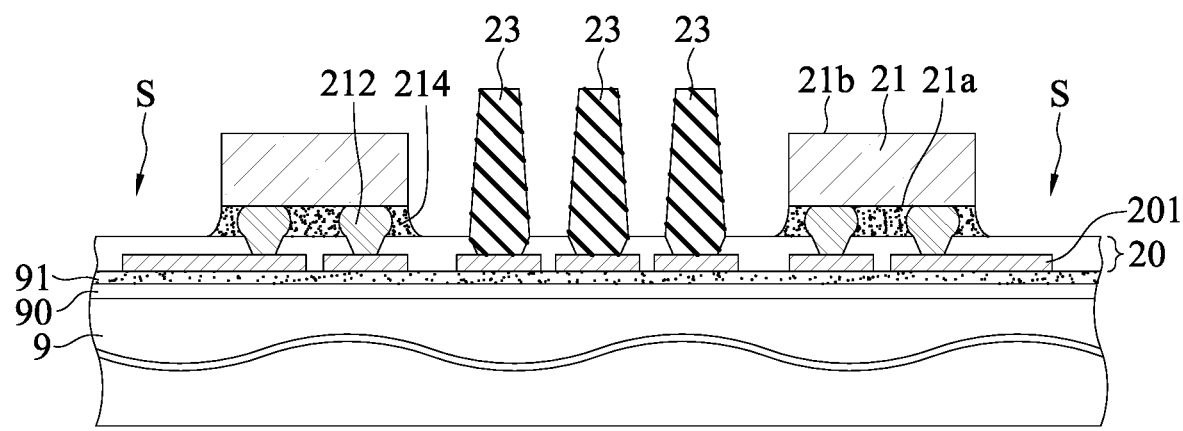

As shown in FIG. 2B, at least one electronic element 21 is disposed on the first circuit structure 20.

The electronic element 21 is an active element, a passive element, or a combination of the active element and the passive element, and the active element is such as a semiconductor chip, and the passive element is such as a resistor, a capacitor, or an inductor.

In an embodiment, the electronic element 21 is a semiconductor chip, which has an active surface 21a and an inactive surface 21b opposite to the active surface 21a, and the active surface 21a has a plurality of electrode pads (not shown), so that the electronic element 21 is bonded onto the first circuit structure 20 by a flip-chip method and its electrode pads are electrically connected to the first circuit layer 201 via a plurality of conductive bumps 212. Further, the conductive bumps 212 can be covered with a bonding layer 214 such as an underfill according to requirements.

Furthermore, if a plurality of the electronic elements 21 are provided, the plurality of conductive pillars 23 can be located between at least two of the electronic elements 21, so that an open area S without conductive material is formed on the periphery of a group where the plurality of electronic elements 21 are distributed.

Figure 2C:
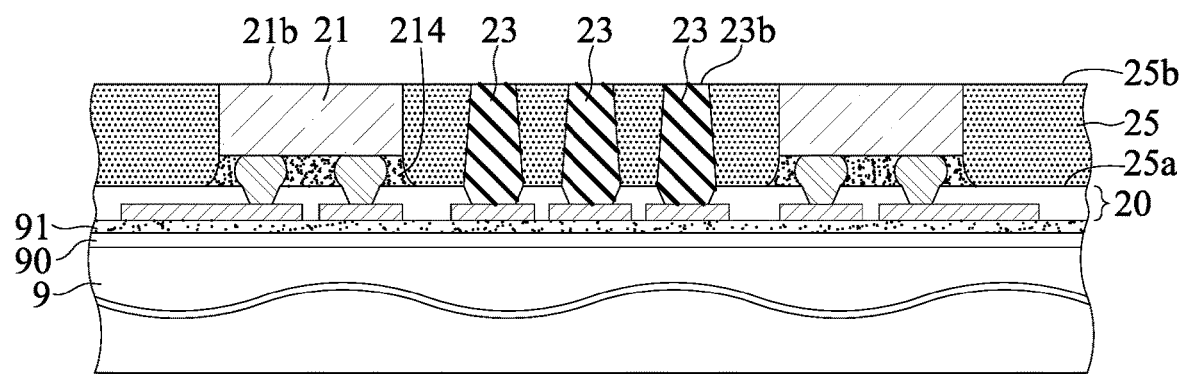

As shown in FIG. 2C, a cladding layer 25 is formed on the first circuit structure 20, so that the cladding layer 25 covers the electronic element 21, the bonding layer 214 and the plurality of conductive pillars 23, wherein the cladding layer 25 has a first surface 25a and a second surface 25b opposite to the first surface 25a, and the cladding layer 25 is bonded to the first circuit structure 20 via the first surface 25a thereof. Then, via a leveling process, the second surface 25b of the cladding layer 25 is flush with end surfaces 23b of the conductive pillars 23 (or the inactive surface 21b of the electronic element 21), so that the end surfaces 23b of the conductive pillars 23 (or the inactive surface 21b of the electronic element 21) is exposed from the second surface 25b of the cladding layer 25.

In an embodiment, the cladding layer 25 is an insulating material, such as polyimide (PI), dry film, epoxy resin, or molding compound, which can be formed on the first circuit structure 20 by lamination or molding.

Furthermore, the leveling process is to remove a portion of the material of each of the conductive pillars 23 and a portion of the material of the cladding layer 25 (even removing a portion of the material of the inactive surface 21b of the electronic element 21) by grinding, so that the second surface 25b of the cladding layer 25 and the end surfaces 23b of the conductive pillars 23 (or the inactive surface 21b of the electronic element 21) are coplanar.

Figure 2D:
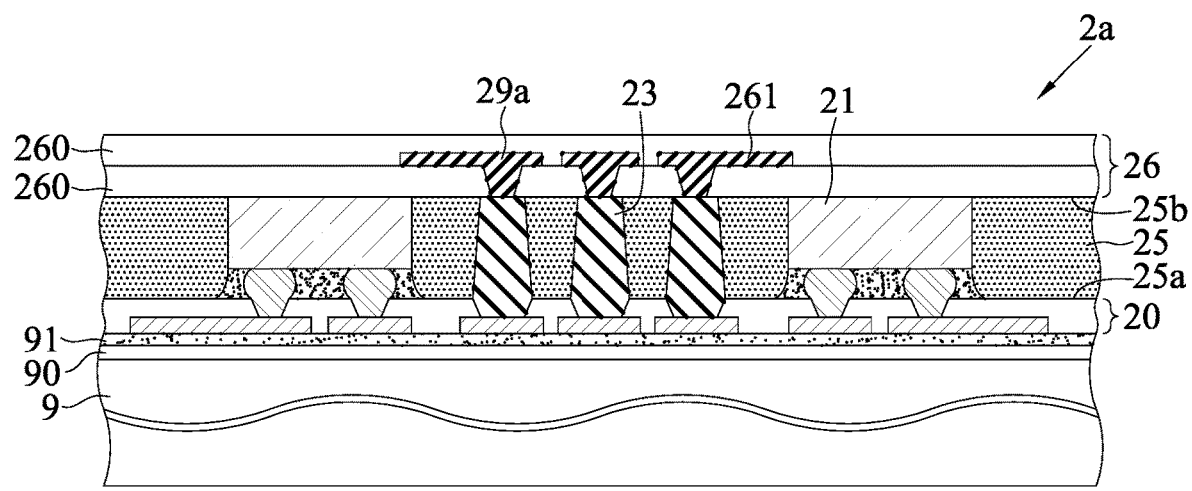

As shown in FIG. 2D, a second circuit structure 26 is formed on the second surface 25b of the cladding layer 25, and the second circuit structure 26 is electrically connected to the conductive pillars 23, so that the second circuit structure 26 is stacked on the first circuit structure 20 to form a package module 2a.

In an embodiment, the second circuit structure 26 includes a second insulating layer 260 and a second circuit layer 261 such as RDL disposed on the second insulating layer 260, so that the second circuit layer 261 is electrically connected to the plurality of conductive pillars 23. Alternatively, the second circuit structure 26 may also include a plurality of second insulating layers 260 and a plurality of second circuit layers 261.

Further, the material for forming the second circuit layer 261 is copper, and the material for forming the second insulating layer 260 is a dielectric material such as polybenzoxazole (PBO), polyimide (PI), prepreg (PP) and the like.

In addition, the second circuit structure 26 is further configured with a second antenna layer 29a electrically connected to the second circuit layer 261. For example, the second antenna layer 29a is fabricated together with the second circuit layer 261 by an RDL process.

It should be understood that there are various types of package modules 2a, which are not limited to the above, and are hereby described.

Figure 2E:
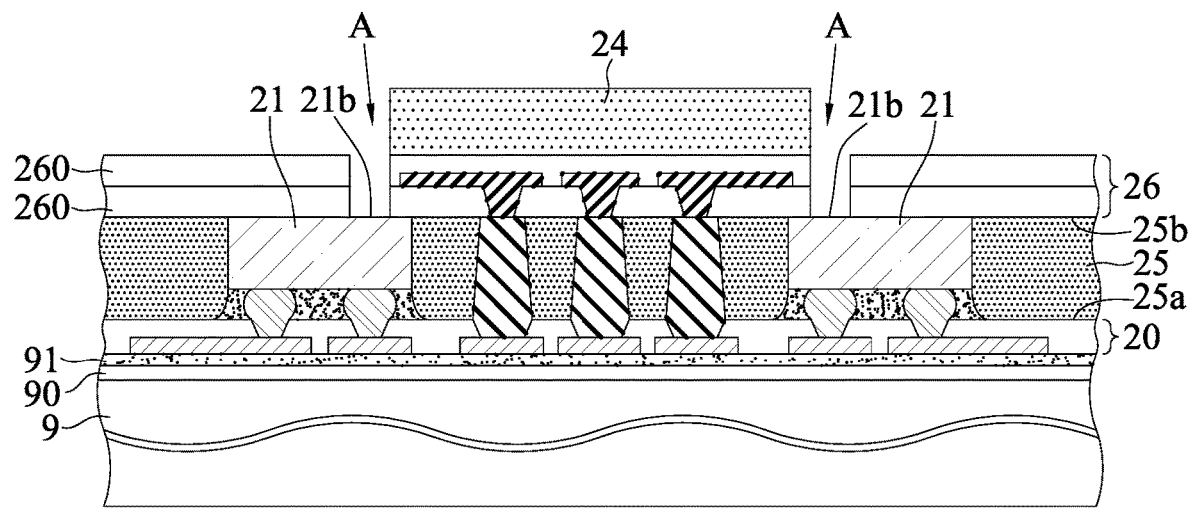

As shown in FIG. 2E, an insulating spacer 24 is formed on the second circuit structure 26, and a recess portion A exposing the electronic element 21 is formed in the second circuit structure 26.

In an embodiment, the insulating spacer 24 is a dielectric layer, which is a dielectric material such as polyimide (PI), dry film, or molding compound and the like, but is not limited to the above. For example, a dielectric layer is first coated on the entire surface of the second circuit structure 26, and then a portion of the material of the dielectric layer is removed by etching to form the insulating spacer 24.

Furthermore, the recess portion A penetrates through the second circuit structure 26 to expose the inactive surface 21b of the electronic element 21; it should be understood that if the cladding layer 25 covers the inactive surface 21b of the electronic element 21, the recess portion A needs to extend into the second surface 25b of the cladding layer 25, so that the inactive surface 21b of the electronic element 21 is exposed from the recess portion A.

Figure 2F:
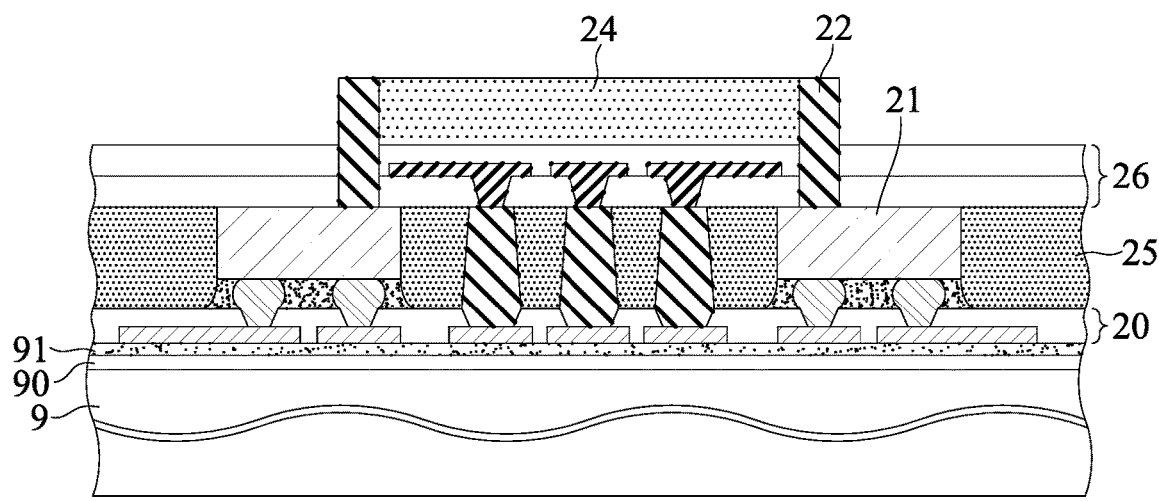

As shown in FIG. 2F, a heat sink 22 is formed in the recess portion A, so that the heat sink 22 is thermally connected to the electronic element 21, and the heat sink 22 protrudes from the second circuit structure 26 (or the surface of the package module 2a).

Figure 3:
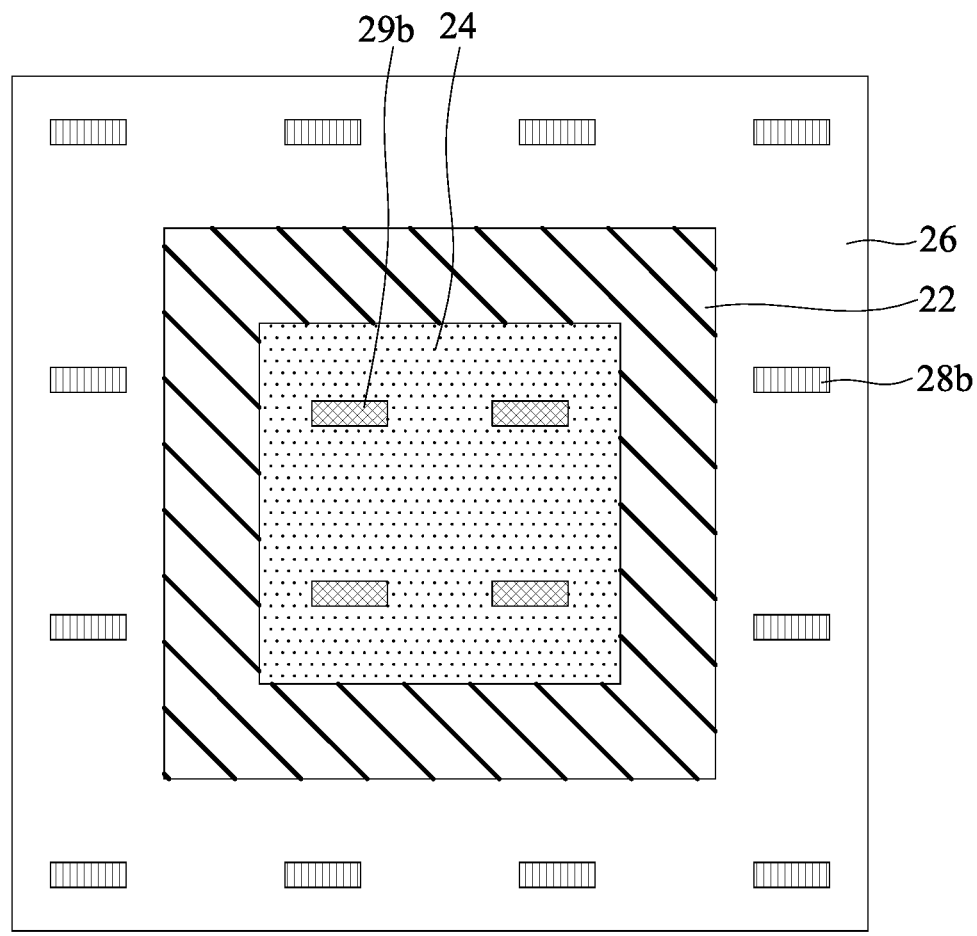
FIG. 3 is a schematic top plan view of FIG. 2H.

In an embodiment, the heat sink 22 is made of a metal material such as copper, and the recess portion A is an annular groove, so that the heat sink 22 is annular so as to surround the insulating spacer 24, as shown in FIG. 3.

Figure 2G:
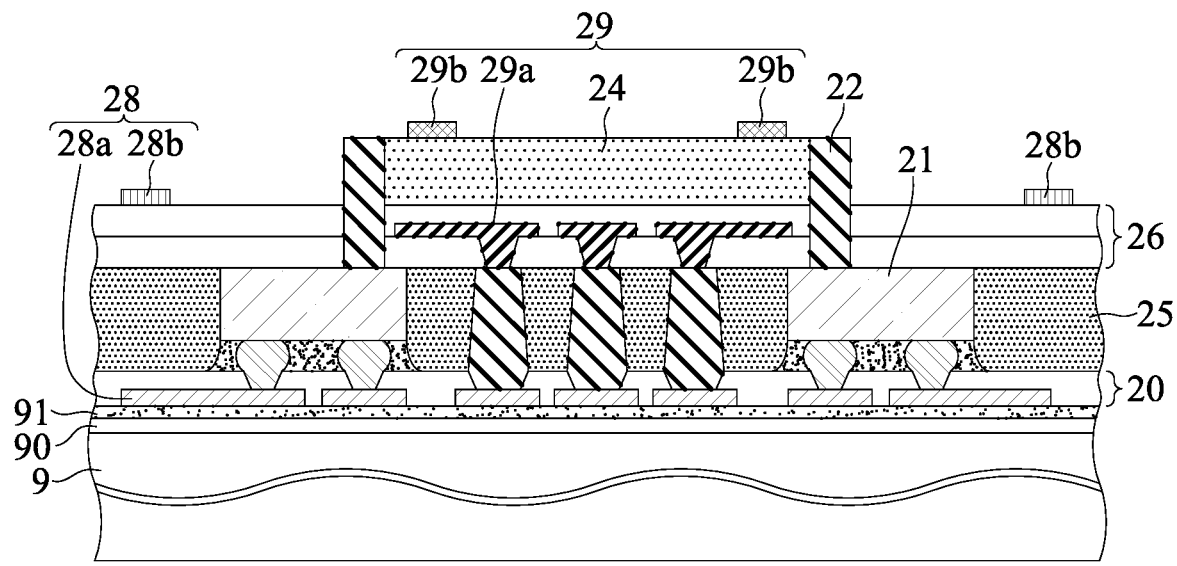

As shown in FIG. 2G, first antenna bodies 28b corresponding to the first antenna layer 28a are formed on portions of the surface of the second insulating layer 260 of the second circuit structure 26, so that a first antenna structure 28 is formed by keeping a distance between the first antenna bodies 28b and the first antenna layer 28a, and second antenna bodies 29b corresponding to the second antenna layer 29a are formed on the insulating spacer 24, so that a second antenna structure 29 is formed such that the second antenna bodies 29b and the second antenna layer 29a are located on opposite sides of the insulating spacer 24, and the first antenna bodies 28b surround the second antenna bodies 29b, as shown in FIG. 3.

In an embodiment, taking the 6 gigahertz (GHz) frequency band as a boundary, the first antenna structure 28 is a low-frequency band antenna, that is, below 6 GHz (commonly known as Sub-6 GHz), and the second antenna structure 29 is a high-frequency band antenna, that is, higher than 6 GHz. For example, the electronic element 21 transmits and receives low-frequency 5G millimeter-wave signals with frequencies of Sub-6 GHz (about 410-7125 megahertz [MHz]) via the first antenna structure 28, and the electronic element 21 transmits and receives high-frequency 5G millimeter-wave (mmWave) signals with frequencies of 24-53 gigahertz (GHz) via the second antenna structure 29.

Furthermore, the first antenna bodies 28b and the first antenna layer 28a transmit signals in a coupled manner, and the first antenna layer 28a is used as a feeding line of the first antenna structure 28. In addition, the second antenna bodies 29b and the second antenna layer 29a also transmit signals in a coupled manner, and the second antenna layer 29a is used as a feeding line of the second antenna structure 29. For example, the antenna layer and the antenna bodies can generate radiated energy from alternating voltage, alternating current, or radiation changes, and the radiated energy is an electromagnetic field, so that the antenna layer and the antenna bodies can be electromagnetically coupled to each other, so that the antenna signal can be transmitted between the antenna layer and the antenna bodies. In addition, there is no other metal layer between the first antenna layer 28a and the first antenna bodies 28b, such as the intervals corresponding to the upper and lower parts of the open area S.

In addition, dielectric regions of the high-frequency band antenna (such as the insulating spacer 24 and the second insulating layer 260) should have a dielectric coefficient less than 3, for example, SiLK, MSQ, PI (including Nano air, fluorine group), or other suitable materials; on the other hand, dielectric regions of the low-frequency band antenna (such as the second insulating layer 260, the cladding layer 25 and the first insulating layer 200) should have a dielectric coefficient less than 3.7, for example, epoxy resin, PI, or other suitable materials.

In addition, the first antenna bodies 28b and the second antenna bodies 29b can be fabricated by means of sputtering, vapor deposition, electroplating, electroless plating, plating, or foiling, etc., so that the first antenna bodies 28b are located outside the ring of the heat sink 22, and the second antenna bodies 29b are located inside the ring of the heat sink 22.

Figure 2H:
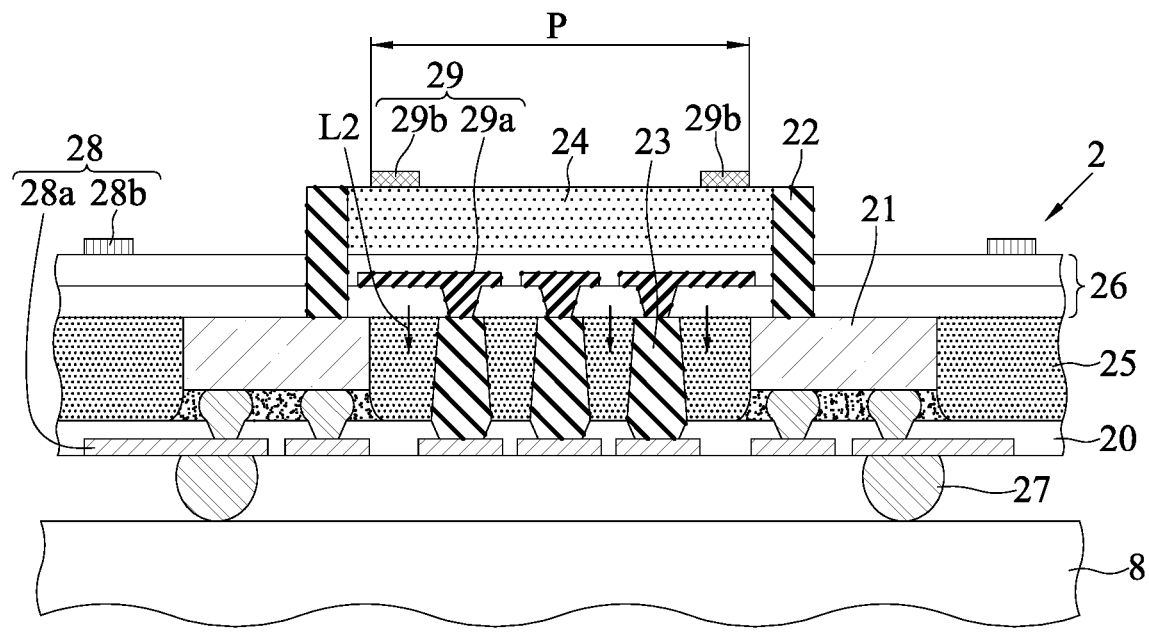

As shown in FIG. 2H, the carrier board 9 and the release layer 90 and the adhesive layer 91 thereon are removed to expose the first circuit structure 20 for forming a plurality of conductive elements 27 such as solder balls on the first circuit layer 201 of the first circuit structure 20 to obtain the electronic package 2 of the present disclosure, so that the electronic package 2 can be mounted on the circuit board 8 via the conductive elements 27 in the subsequent process.

In an embodiment, an Under Bump Metallurgy (UBM) layer may be formed on the first circuit layer 201 according to requirements to facilitate the bonding of the conductive elements 27.

Therefore, in the manufacturing method of the present disclosure, the heat sink 22 extends and protrudes from the package module 2a, so as to guide the thermal energy generated by the electronic element 21 out of the package module 2a, so that the electronic element 21 can dissipate heat according to requirements. Therefore, compared with the prior art, when the electronic package 2 is configured with the first antenna structure 28 and the second antenna structure 29, the heat dissipation required by the electronic element 21 can still be met, so that the electronic package 2 is made to provide electrical functions required for operating the 5G system, so as to meet the requirements of the antenna operation of the 5G system.

Furthermore, by disposing the conductive pillars 23 between two electronic elements 21, the second antenna structure 29 is superimposed on the conductive pillars 23 and the electronic elements 21, so as to facilitate reducing the path of the second antenna structure 29 transmitting the antenna signal to the circuit board 8 (the conductive elements 27), such that the transmission speed of the antenna signal can be increased. For example, the signal of the second antenna structure 29 can be transmitted to the circuit board 8 via the conductive pillars 23 below the second antenna structure 29, and a path of the second antenna structure 29 passing through the second circuit structure 26 (a signal path L2 shown in FIG. 2H) is located within a vertical projection area P of the second antenna structure 29 without fanning out to the periphery of the vertical projection area P of the second antenna structure 29, thereby greatly reducing the path for transmitting the antenna signal of the second antenna structure 29.

Furthermore, the configuration of the insulating spacer 24 facilitates the integration of the first antenna structure 28 and the second antenna structure 29 on the package module 2a without interfering with each other, so that the electronic package 2 can send/receive different antenna signals according to requirements. Therefore, the electronic package 2 can be configured with antenna structures including multiple frequencies, so that a single electronic package 2 can meet the needs of radio-frequency products with multiple frequencies.

The present disclosure further provides an electronic package 2, which comprises: a package module 2a, at least one heat sink 22, an insulating spacer 24, first antenna bodies 28b and second antenna bodies 29b.

The package module 2a is internally configured with at least one electronic element 21 and a plurality of feeding lines electrically connected to the electronic element 21, wherein the plurality of feeding lines are defined with a first antenna layer 28a and a second antenna layer 29a.

The heat sink 22 is disposed on a portion of the surface of the package module 2a and extends into the package module 2a to thermally connect the electronic element 21.

The first antenna bodies 28b are disposed on portions of the surface of the package module 2a corresponding to the position of the first antenna layer 28a, and a distance is maintained between the first antenna bodies 28b and the first antenna layer 28a, so that the first antenna bodies 28b and the first antenna layer 28a form a first antenna structure 28.

The insulating spacer 24 is disposed on a portion of the surface of the package module 2a.

The second antenna bodies 29b are disposed on the insulating spacer 24 corresponding to the position of the second antenna layer 29a, and the second antenna bodies 29b and the second antenna layer 29a are located on opposite sides of the insulating spacer 24, so that the second antenna structure 29 is formed by the second antenna bodies 29b and the second antenna layer 29a.

In one embodiment, the heat sink 22 is annular.

In one embodiment, the heat sink 22 surrounds the insulating spacer 24.

In one embodiment, the first antenna bodies 28b and the first antenna layer 28a transmit signals in a coupled manner.

In one embodiment, the insulating spacer 24 is a dielectric layer.

In one embodiment, the second antenna bodies 29b and the second antenna layer 29a transmit signals in a coupled manner.

In one embodiment, the package module 2a includes a cladding layer 25 covering the electronic element 21, so that the first antenna bodies 28b and the first antenna layer 28a are located on opposite sides of the cladding layer 25. Further, the package module 2a further includes a plurality of conductive pillars 23, which are embedded in the cladding layer 25, and a first circuit structure 20 and a second circuit structure 26, which are disposed on opposite sides of the cladding layer 25 to be electrically connected to each other via the plurality of conductive pillars 23, so that the first circuit structure 20 is provided with the first antenna layer 28a, and the second circuit structure 26 is provided with the second antenna layer 29a, such that the insulating spacer 24 and the first antenna bodies 28b are disposed on one surface of the second circuit structure 20. For example, a plurality of the electronic elements 21 are embedded in the cladding layer 25, so that the plurality of conductive pillars 23 are located between at least two of the electronic elements 21; or, the second antenna structure 29 is superimposed on the conductive pillars 23.

In one embodiment, the heat sink 22 is in contact with the electronic element 21.

To sum up, the electronic package and the manufacturing method thereof of the present disclosure facilitate the heat dissipation of the electronic element by the design of the heat sink. Therefore, when the electronic product using this electronic package operates the antenna function of various frequencies, it can maintain the normal radio-frequency function and will not cause poor conditions due to overheating.

Furthermore, by superimposing the second antenna structure on the plurality of conductive pillars, it is beneficial to reduce the path for the second antenna structure to transmit the antenna signal to the external circuit board, so that the transmission speed of the antenna signal can be increased.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
a package module internally configured with at least one electronic element and a plurality of feeding lines electrically connected to the at least one electronic element, wherein the plurality of feeding lines are defined with a first antenna layer and a second antenna layer;
a heat sink disposed on a portion of a surface of the package module and extending into the package module to thermally connect the at least one electronic element;
first antenna bodies disposed on portions of the surface of the package module corresponding to a position of the first antenna layer, wherein the first antenna bodies and the first antenna layer are kept at a distance, such that the first antenna bodies and the first antenna layer form a first antenna structure;
an insulating spacer disposed on a portion of the surface of the package module; and
second antenna bodies disposed on the insulating spacer corresponding to a position of the second antenna layer, wherein the second antenna bodies and the second antenna layer are located on opposite sides of the insulating spacer, such that the second antenna bodies and the second antenna layer form a second antenna structure.

2. The electronic package of claim 1, wherein the heat sink is annular.

3. The electronic package of claim 1, wherein the heat sink surrounds the insulating spacer.

4. The electronic package of claim 1, wherein the insulating spacer is a dielectric layer.

5. The electronic package of claim 1, wherein the first antenna bodies and the first antenna layer and the second antenna bodies and the second antenna layer transmit signals in a coupled manner.

6. The electronic package of claim 1, wherein the package module includes a cladding layer covering the at least one electronic element, and wherein the first antenna bodies and the first antenna layer are located on opposite sides of the cladding layer.

7. The electronic package of claim 6, wherein the package module further includes a plurality of conductive pillars embedded in the cladding layer and a first circuit structure and a second circuit structure disposed on the opposite sides of the cladding layer to be electrically connected to each other via the plurality of conductive pillars, and wherein the first circuit structure is provided with the first antenna layer, and the second circuit structure is provided with the second antenna layer, such that the insulating spacer and the first antenna bodies are disposed on one surface of the second circuit structure.

8. The electronic package of claim 7, wherein the second antenna structure is superimposed on the plurality of conductive pillars.

9. The electronic package of claim 7, wherein a plurality of the electronic elements are embedded in the cladding layer, such that the plurality of conductive pillars are located between at least two of the electronic elements.

10. The electronic package of claim 1, wherein the heat sink is in contact with the at least one electronic element.

11. A method of manufacturing an electronic package, comprising:
providing a package module internally configured with at least one electronic element and a plurality of feeding lines electrically connected to the at least one electronic element, wherein the plurality of feeding lines are defined with a first antenna layer and a second antenna layer;
disposing an insulating spacer on a portion of a surface of the package module;
forming a heat sink on a portion of the surface of the package module, wherein the heat sink extends into the package module to thermally connect the at least one electronic element; and
forming first antenna bodies on portions of the surface of the package module corresponding to a position of the first antenna layer and forming second antenna bodies on the insulating spacer corresponding to a position of the second antenna layer, wherein the first antenna bodies and the first antenna layer are kept at a distance, such that the first antenna bodies and the first antenna layer form a first antenna structure, and wherein the second antenna bodies and the second antenna layer are located on opposite sides of the insulating spacer, such that the second antenna bodies and the second antenna layer form a second antenna structure.

12. The method of claim 11, wherein the heat sink is annular.

13. The method of claim 11, wherein the heat sink surrounds the insulating spacer.

14. The method of claim 11, wherein the insulating spacer is a dielectric layer.

15. The method of claim 11, wherein the first antenna bodies and the first antenna layer and the second antenna bodies and the second antenna layer transmit signals in a coupled manner.

16. The method of claim 11, wherein the package module includes a cladding layer covering the at least one electronic element, and wherein the first antenna bodies and the first antenna layer are located on opposite sides of the cladding layer.

17. The method of claim 16, wherein the package module further includes a plurality of conductive pillars embedded in the cladding layer and a first circuit structure and a second circuit structure disposed on the opposite sides of the cladding layer to be electrically connected to each other via the plurality of conductive pillars, and wherein the first circuit structure is provided with the first antenna layer, and the second circuit structure is provided with the second antenna layer, such that the insulating spacer and the first antenna bodies are disposed on one surface of the second circuit structure.

18. The method of claim 17, wherein a plurality of the electronic elements are embedded in the cladding layer, such that the plurality of conductive pillars are located between at least two of the electronic elements.

19. The method of claim 17, wherein the second antenna structure is superimposed on the plurality of conductive pillars.

20. The method of claim 11, wherein the heat sink is in contact with the at least one electronic element.

21. The method of claim 11, wherein a manufacturing process of the heat sink comprises:
- forming a recess portion in the package module to expose the at least one electronic element; and
- forming a metal material in the recess portion and protruding from the surface of the package module, so that the metal material becomes the heat sink.

\* \* \* \* \*